(12) United States Patent
Huang et al.

(10) Patent No.: US 8,084,790 B2
(45) Date of Patent: Dec. 27, 2011

(54) IMAGE SENSING DEVICE AND PACKAGING METHOD THEREOF

(75) Inventors: Chi-Chih Huang, Tao-Yuan Hsien (TW); Chih-Yang Hsu, Tao-Yuan Hsien (TW)

(73) Assignee: Tong Hsing Electronic Industries, Inc., Taipei (TW)

( * ) Notice: Subject to any disclaimer, the term of this patent is extended or adjusted under 35 U.S.C. 154(b) by 0 days.

(21) Appl. No.: 12/848,621

(22) Filed: Aug. 2, 2010

(65) Prior Publication Data

US 2010/0295099 A1    Nov. 25, 2010

Related U.S. Application Data

(62) Division of application No. 12/222,083, filed on Aug. 1, 2008, now Pat. No. 7,811,861.

(51) Int. Cl.
*H01L 27/148* (2006.01)
*H01L 29/768* (2006.01)
*H01L 31/00* (2006.01)

(52) U.S. Cl. . 257/225; 257/433; 257/434; 257/E31.053; 257/E31.073; 257/E31.113

(58) Field of Classification Search .............. 257/225, 257/290, 443, 434, E31.073, E31.053, E31.113
See application file for complete search history.

(56) References Cited

U.S. PATENT DOCUMENTS

| | | |
|---|---|---|
| 2002/0048842 A1 | 4/2002 | Lin et al. |
| 2009/0032925 A1 | 2/2009 | England |
| 2009/0117689 A1 | 5/2009 | Chen |
| 2009/0256229 A1 | 10/2009 | Ishikawa et al. |
| 2010/0008203 A1 | 1/2010 | Furuyashiki et al. |

*Primary Examiner* — David S Blum
(74) *Attorney, Agent, or Firm* — Bacon & Thomas, PLLC

(57) ABSTRACT

An image sensing device and packaging method thereof is disclosed. The packaging method includes the steps of a) providing an image sensing module, having a light-receiving region exposed, on a first substrate; b) forming a plurality of first contacts around the light-receiving region on the image sensing module; c) providing a second substrate, having a plurality of second contacts corresponding to the plurality of first contacts and an opening for allowing the light-receiving region to be exposed while the second substrate is placed over the image sensing module, the plurality of second contacts being disposed around the opening; d) connecting the plurality of first contacts and the plurality of second contacts; and e) disposing a transparent lid above the light-receiving region, on a side of the second substrate which is opposite to the plurality of second contacts.

9 Claims, 5 Drawing Sheets

IMAGE SENSING DEVICE AND PACKAGING METHOD THEREOF

CROSS-REFERENCE TO RELAETED APPLICATIONS

This application is a divisional application of U.S. Ser. No. 12/222,083, now U.S. Pat. No. 7,811,861 filed Aug. 1, 2008

BACKGROUND OF THE INVENTION

1. Field of the Invention

The present invention relates to an image sensing device and packaging method thereof, and more particularly, to an image sensing device with a reduced size.

2. Description of Related Art

Miniaturization of semiconductor device has been an important topic in the art, when the device requires more I/O pins along with the increase of device density. The multiple I/O pins, however, require the lead pitch of the package device to be smaller. As a result, the leads become more fragile to external impacts, the performance of the final package device may degrade due to parasitic parameters of the thinner package leads, and more attention should be paid in management of the package device.

Ball Grid Array (hereinafter abbreviated as "BGA") packages known from e.g., U.S. Pat. No. 5,355,283 are new and upgraded versions of PGA (Pin Grid Array) packages. The BGA packages are more suitable for use in high I/O pin devices than PGA packages, since they can avoid negative inductive parameters of the long pin leads of the PGA package while maintaining the efficiency of the I/O pins of the Grid Array packages. Further, the BGA package is capable of high mounting density since it can, unlike the PGA package, utilize a Surface Mount Technique (SMT).

FIG. 1 shows a conventional BGA package 10. A semiconductor chip 11 on which a predetermined circuit pattern is formed through a wafer process is mounted onto a substrate 12, for example, printed circuit board (PCB). The electrical interconnection between the chip 11 and the PCB 12 is achieved by bonding wires 13. An encapsulation resin 14 such as an epoxy molding compound is used to protect the chip and the bonding wires from the external environment. On the bottom surface 15 of the PCB 12 are attached a plurality of solder balls 16. Because the solder balls 16 and the semiconductor chip 11 are electrically interconnected by a pre-designed wiring pattern (not shown) within the PCB 12, both electrical signals from external devices to the chip 11 and data signals from the chip 11 can pass through the solder balls 16. Particularly, if the solder balls 16 were used as supply power or ground power terminals, the shorter electrical length of the solder balls 16 would reduce the inductance and resistance of the package leads. The solder balls 16 further contribute to the heat dissipation from the semiconductor chip 11.

However, the amount of bonding wires 13 is limited by the size of the BGA package 10. In other words, the more bonding wires contained the larger the BGA package 10 has to be. Meanwhile, the height of the BGA package 10 is also limited by the bonding wires 13.

Thus, in order to accomplish miniaturization of semiconductor device there is a demonstrated need for an image sensing device having improved interconnection, especially between the chip and the PCB, and a method of packaging the same.

SUMMARY OF THE INVENTION

Accordingly, the prior arts are limited by the above problems. It is an object of the present invention to provide a packaging method that can produce a smaller size image sensing device.

In accordance with an aspect of the present invention, a packaging method for an image sensing device includes the steps of a) providing an image sensing module, having a light-receiving region exposed, on a first substrate; b) forming a plurality of first contacts around the light-receiving region on the image sensing module; c) providing a second substrate, having a plurality of second contacts corresponding to the plurality of first contacts and an opening for allowing the light-receiving region to be exposed while the second substrate is placed over the image sensing module, the plurality of second contacts being disposed around the opening; d) connecting the plurality of first contacts and the plurality of second contacts; and e) disposing a transparent lid above the light-receiving region, on a side of the second substrate which is opposite to the plurality of second contacts.

Preferably, the packaging method further includes a step of filling an adhesive into gaps formed between the plurality of first contacts and the plurality of second contacts.

Preferably, the transparent lid is attached to the second substrate by surface mount technology (SMT).

Preferably, the plurality of first contacts and the plurality of second contacts are made of tin or gold.

Preferably, the image sensing module includes complementary metal oxide semiconductor (CMOS) image sensor or charge coupled device (CCD) image sensor.

Preferably, the first substrate includes aluminum nitride ceramic, fiberglass-reinforced epoxy resin, or bismaleimide-triazine resin.

Preferably, the first substrate is glass.

Preferably, the second substrate is a circuit board.

In accordance with another aspect of the present invention, An image sensing device includes a first substrate; an image sensing module mounted on the first substrate, having a light-receiving region exposed; a second substrate disposed above the image sensing module which is electrically connected to the second substrate; and a transparent lid formed on the second substrate above the light-receiving region.

Preferably, the image sensing module is electrically connected to the second substrate via a plurality of contacts.

Preferably, the plurality of contacts are made of tin or gold.

Preferably, the plurality of contacts have gaps formed therebetween and an adhesive is added into the gaps.

Preferably, the transparent lid is attached to the second substrate by surface mount technology (SMT).

Preferably, the image sensing module includes complementary metal oxide semiconductor (CMOS) image sensor or charge coupled device (CCD) image sensor.

Preferably, the first substrate includes aluminum nitride ceramic, fiberglass-reinforced epoxy resin, or bismaleimide-triazine resin.

Preferably, the first substrate is glass.

Preferably, the second substrate is a circuit board.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiment. It is to be noted that the following descriptions of preferred embodiment of this invention are presented herein for purpose of illustration and description only; it is not intended to be exhaustive or to be limited to the precise form disclosed.

Figure 1:
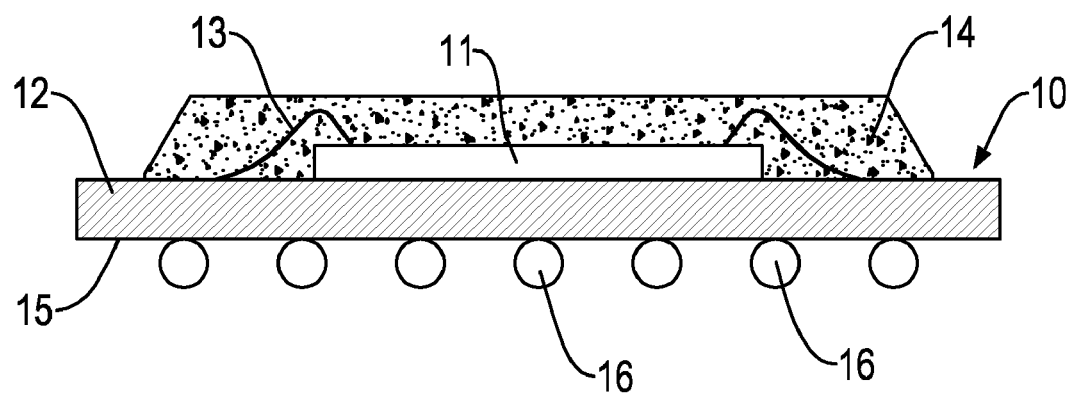
FIG. 1 illustrates an image sensing device according to the prior art.
Figure 2A:
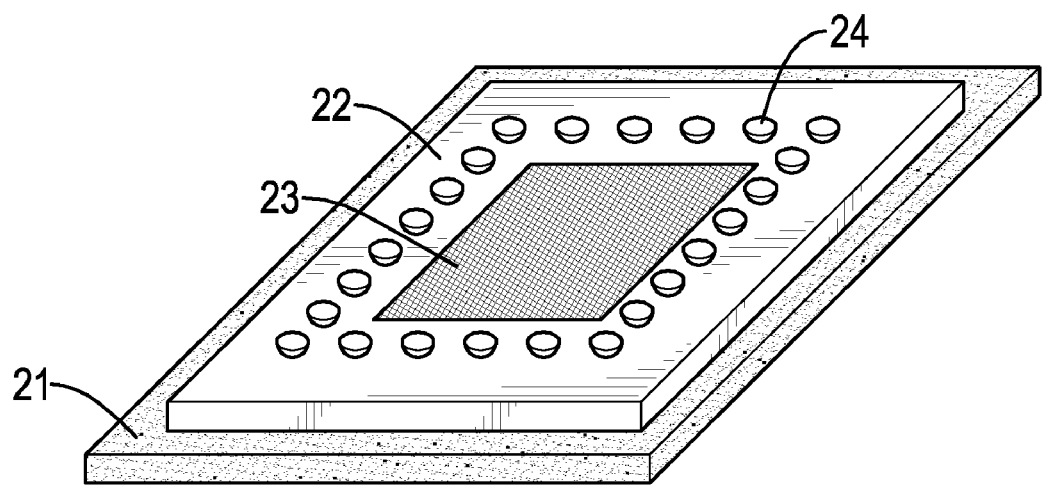
FIGS. 2A-2D are schematic diagrams showing an embodiment of packaging method for an image sensing device according to the present invention.

Please refer to FIGS. 2A-2D. They illustrate an embodiment of packaging method for an image sensing device according to the present invention. Firstly, please refer to FIG. 2A. FIG. 2A is a schematic diagram of an image sensing module 22 placed on a substrate 21. The image sensing module 22 has a light-receiving region 23 and a number of contacts 24 which are disposed around the light-receiving region 23. These contacts 24 may be made of metallic materials such as tin or gold to provide electrical connection with the image sensing module 22.

In this embodiment, the contacts 24 are printed on the image sensing module 22 at the wafer level, i.e. the image sensing module 22 is singulated after the contacts 24 are printed in order to reduce the production cost and time.

The substrate 21 is used to prevent the image sensing module 22 from being damaged. The substrate 21 can be made of aluminum nitride ceramic, fiberglass-reinforced epoxy resin, or bismaleimide-triazine resin. Besides, the substrate 21 can also be made of glass.

Figure 2B:
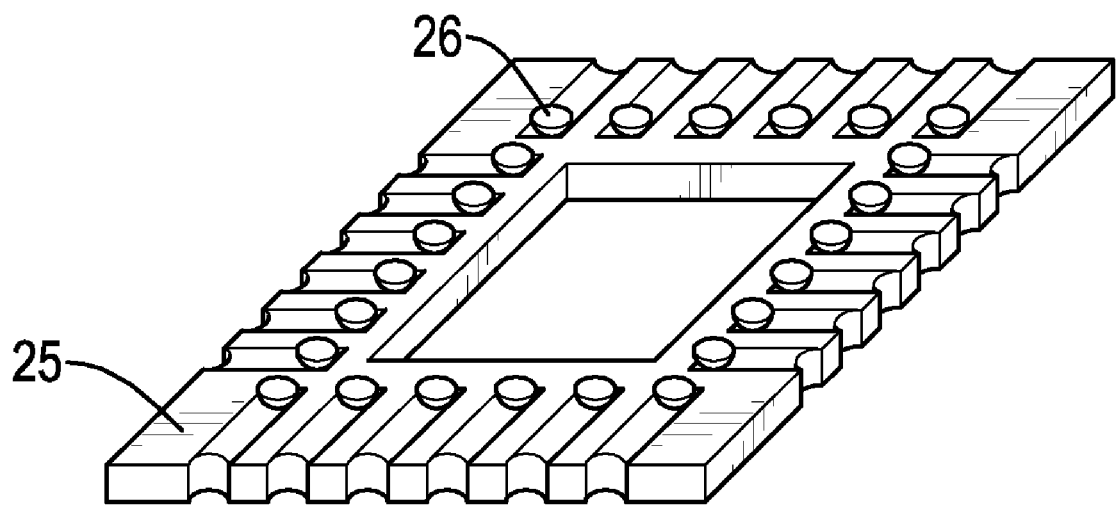

Next, FIG. 2B is a schematic diagram of a circuit board 25. The circuit board 25 has a number of connecting units 26. These connecting units 26 are used as an interface to connect the circuit board 25 and the image sensing module 22, and therefore, the amount and disposition of the connecting units 26 on the circuit board 25 are the same as those of the contacts 24 on the image sensing module 22. Due to the fact that the connecting units 26 are used to electrically connect the circuit board 25 and the image sensing module 22, the connecting units 26 are also made of metallic materials such as tin or gold.

Traditionally, connections between circuit boards and image sensing modules are achieved by bonding wires. However, the amount of bonding wires accommodated in an image sensing device may be limited by the size of the image sensing device. In other words, the more bonding wires contained the larger the image sensing device has to be. Meanwhile, the height of the image sensing device is also limited by the bonding wires.

Figure 2C:
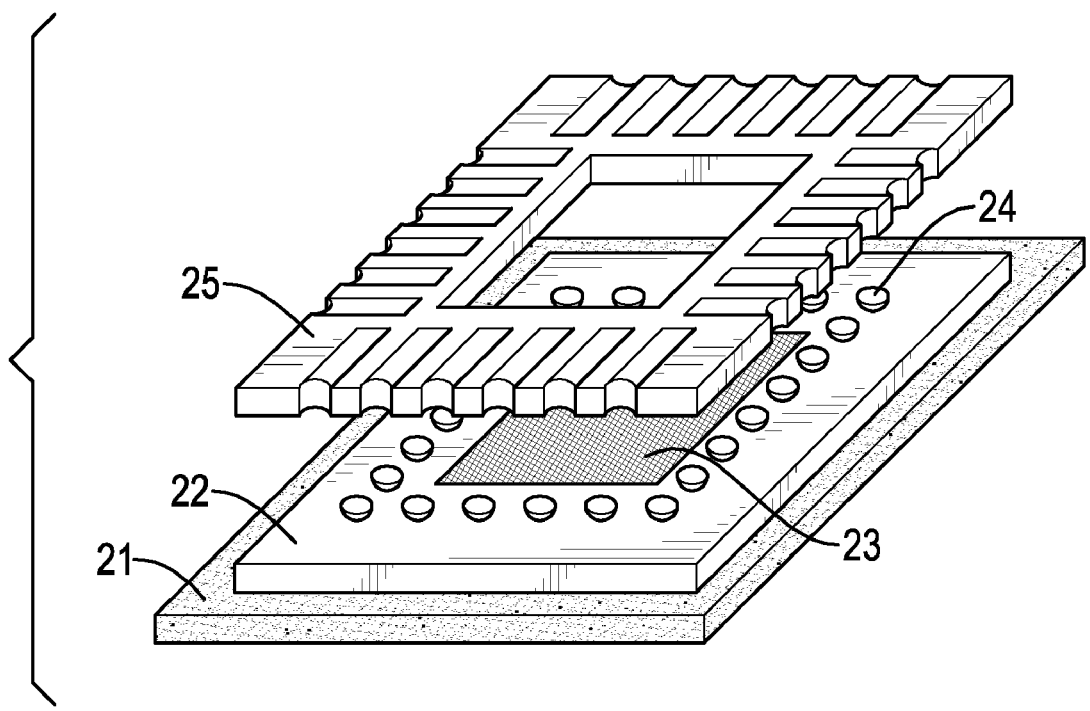

Hence, by the use of the connecting units 26 on the circuit board 25 and the contacts 24 on the image sensing module 22, the space between the circuit board 25 and the image sensing module 22 can be reduced, thereby minimizing the overall size of the image sensing device. As shown in FIG. 2C, the circuit board 25 is facing downwardly and disposed above the image sensing module 22. The circuit board 25 has an opening for allowing the light-receiving region 23 to be exposed.

As shown in FIGS. 2A and 2B, either the contacts 24 on the image sensing module 22 or the connecting units 26 on the circuit board 25 have gaps (not shown) formed between adjacent contacts 24 or connecting units 26. Therefore, an adhesive (not shown) is added between the gaps to avoid incident light from being scattered.

Figure 2D:
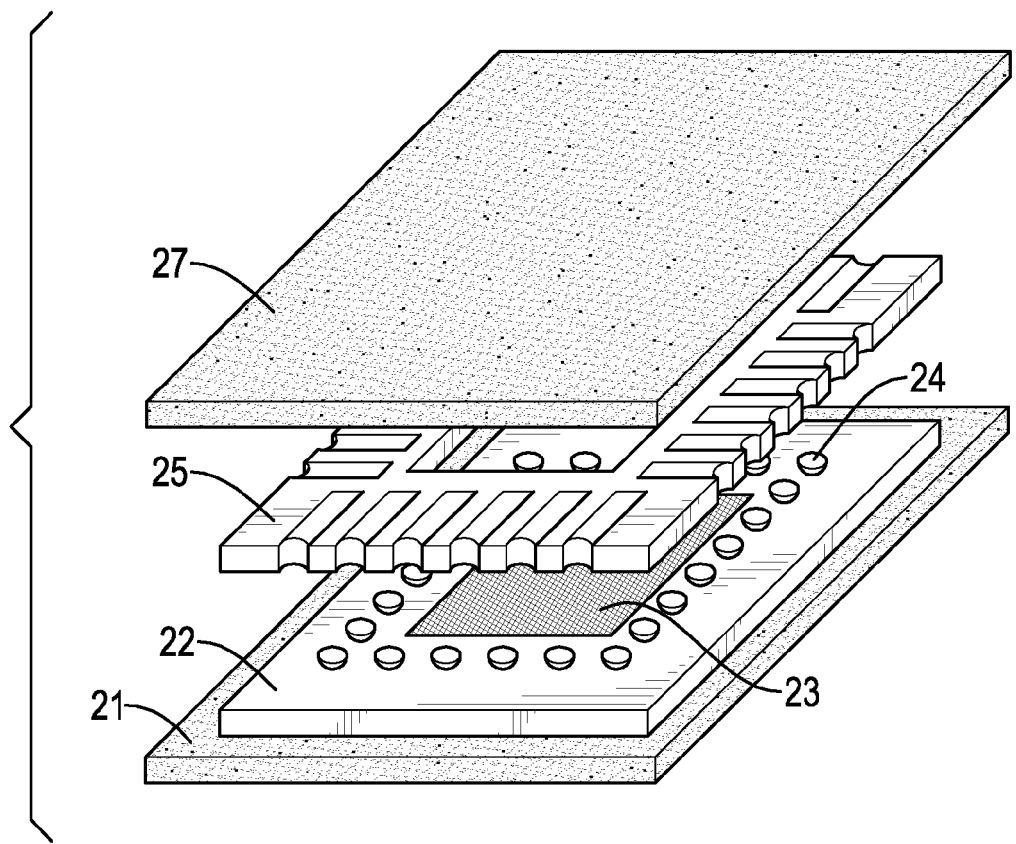

Finally, a transparent lid 27 is disposed on the circuit board 25 above the light-receiving region 23 for preventing the light-receiving region from being polluted or damaged, as shown in FIG. 2D. In this embodiment, the transparent lid 27 is attached to the circuit board 25 by surface mount technology (SMT) and the transparent lid 27 is made of glass.

Furthermore, the image sensing module 22 can be complementary metal oxide semiconductor (CMOS) image sensor or charge coupled device (CCD) image sensor.

While the invention has been described in terms of what is presently considered to be the most practical and preferred embodiment, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. An image sensing device, comprising:
   a first substrate;
   an image sensing module mounted on said first substrate, having a light-receiving region exposed;
   a second substrate disposed above said image sensing module which is electrically connected to said second substrate; and
   a transparent lid formed on said second substrate above said light-receiving region.

2. The image sensing device according to claim 1, wherein said image sensing module is electrically connected to said second substrate via a plurality of contacts.

3. The image sensing device according to claim 2, wherein said plurality of contacts are made of tin or gold.

4. The image sensing device according to claim 2, wherein said plurality of contacts have gaps formed therebetween and an adhesive is added into the gaps.

5. The image sensing device according to claim 1, wherein said transparent lid is attached to said second substrate by surface mount technology (SMT).

6. The image sensing device according to claim 1, wherein said image sensing module comprises complementary metal oxide semiconductor (CMOS) image sensor or charge coupled device (CCD) image sensor.

7. The image sensing device according to claim 1, wherein said first substrate comprises aluminum nitride ceramic, fiberglass-reinforced epoxy resin, or bismaleimide-triazine resin.

8. The image sensing device according to claim 1, wherein said first substrate is glass.

9. The image sensing device according to claim 1, wherein said second substrate is a circuit board.

* * * * *